United States Patent

Robinson, Sr.

[11] 4,130,776
[45] Dec. 19, 1978

[54] EL BAR GRAPH FOR DISPLAYING ANALOGUE MEASUREMENTS OF TEMPERATURE AND THE LIKE

[75] Inventor: Thomas L. Robinson, Sr., East Aurora, N.Y.

[73] Assignee: T. L. Robinson Co., Inc., East Aurora, N.Y.

[21] Appl. No.: 873,471

[22] Filed: Jan. 30, 1978

[51] Int. Cl.² .............................................. H05B 33/02
[52] U.S. Cl. ........................................ 313/507; 324/96
[58] Field of Search ............................ 313/507; 324/96

[56] References Cited

U.S. PATENT DOCUMENTS

| 3,059,144 | 10/1962 | Bowerman, Jr. | 313/507 X |
| 3,309,610 | 3/1967 | Yamamoto | 313/507 X |
| 3,904,924 | 9/1975 | Hilsum et al. | 313/507 X |

*Primary Examiner*—Palmer C. Demeo
*Attorney, Agent, or Firm*—Shlesinger, Fitzsimmons & Shlesinger

[57] ABSTRACT

Each of a row of spaced, parallel, fired-on silver electrodes or bar segments on the face of a substrate has one end thereof disposed in spaced, confronting relation to one edge of an elongate terminal of fired-on silver, which is formed on the face of the substrate parallel to the row of segments. A plurality of wire-sized grids project from said one end of each segment into spaced, parallel, intermeshed relation with a plurality of similar grids which project from the inner edge of the terminal. These spaced sets of grids, there being one such set for each segment, are coated with a photoconductive material to form with the associated set of grids a light-sensitive switch. A first EL lamp overlies the sets of grids or switches with its light-transmitting side facing downwardly; and a second EL lamp overlies the bar segments with its light-transmitting side facing upwardly. Normally when an AC signal is applied across said terminal and the upper electrode on the second lamp, the latter is not illuminated. However, when an analogue ramp voltage, generated in response to a changing parameter such as temperature, pressure, etc., is applied across electrodes of the first lamp at one end thereof, as the amplitude of the ramp voltage increases the first lamp will be illuminated progressively from said one end thereof toward the other, and its downwardly facing illumination will progressively switch the sets of grids to conductive modes therefore causing the bar segments, as they become energized, to illuminate registering, bar-shaped portions of the second lamp.

10 Claims, 4 Drawing Figures

EL BAR GRAPH FOR DISPLAYING ANALOGUE MEASUREMENTS OF TEMPERATURE AND THE LIKE

This invention relates to electroluminescent light panels, and more particularly to a novel EL bar-graph-type panel which is responsive to variations in an electrical ramp signal. Even more particularly, this invention is concerned with the production of a segmented EL panel which can be used visually to denote changes in analogue measurements of parameters such as temperature, speed, pressure, and the like.

While there are available on the market numerous electrically-operated devices for providing visual indication of frequently changing parameters, such as temperature, pressure, voltage, etc., there are no satisfactory yet relatively simple and inexpensive devices which utilize electroluminescent lamps for this purpose. Moreover, to the extent that such devices are available, they generally require the use of numerous electrical components which are costly and subject to failure.

It is an object of this invention, therefore, to provide an EL bar-graph-type device which is particularly suited for making analogue measurements, such as, for example, temperature, pressure, speed, etc., which are applied to the bar graph in the form of an electrical ramp signal.

A further object of this invention is to provide an EL bar-graph-type device which is relatively simple and inexpensive to manufacture, and which is extremely compact and easy to handle.

Another object of this invention is to provide an EL lamp type of measuring device which uses a minimum of electrical components for producing discreet, visual indications in the change of parameters such as temperature, pressure, speed, etc.

Other objects of the invention will be apparent hereinafter from the specification and from the recital of the appended claims, particularly when read in conjunction with the accompanying drawing.

Figure 1:
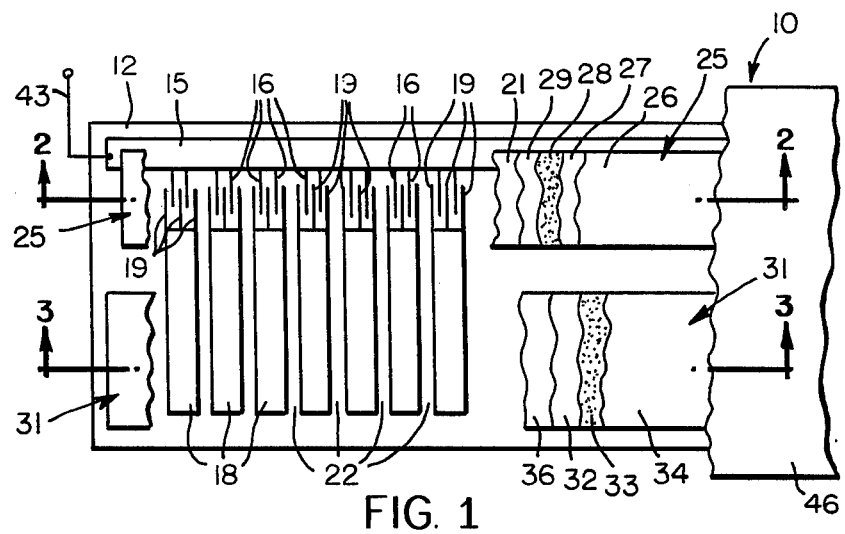
FIG. 1 is a fragmentary plan view of part of a thermometer-type EL bar graph made according to one embodiment of this invention, portions of the gar graph being cut away for purposes of illustration.

Referring now to the drawing by numerals of reference, 10 denotes generally a thermometer-type EL bar graph comprising a substrate 12 which must be able to withstand very high processing temperatures ranging from 500° C. to 850° C. Accordingly, the substrate is made from materials such as high temperature glass, quartz or ceramic or a metal sheet having an insulating layer of ceramic frit fired on its surface (upper surface in FIG. 1). The underside of substrate 12 is covered in a conventional manner by an opaque light shield 13 to prevent transmission of light from the underside of the substrate as noted hereinafter.

Deposited on the surface of substrate 12, and extending longitudinally thereof along the upper edge of the substrate as shown in FIG. 1, is a thin, generally rectangular conductor 15, which may be made of fired-on silver or similar conductive material. Integral with conductor 15, and projecting equi-distantly at right angles from the inner edge thereof (the lower edge as shown in FIG. 1) are a plurality of spaced, parallel electrodes 16, which are in the form of very fine grids or wires.

Also on the upper surface of substrate 12 in equi-spaced relation to the conductor 15 are a plurality of thin, rectangular bar segments 18, which are identical in configuration, and which also may comprise fired-on silver. Segments 18 extend at right angles to the conductor 15, and are arranged in spaced, parallel relation to one another in a single row that extends longitudinally of substrate 12, and parallel to the conductor 15. The inner end of each segment 18 (the upper end as shown in FIG. 1) is spaced from the conductor 15 and has projecting equi-distantly therefrom a plurality (three in the embodiment illustrated) of spaced, parallel grid-type electrodes 19. The electrodes 19 on each bar segment 18 are disposed in spaced, parallel, overlapping or interleaved relation with a registering pair of electrodes 16 on conductor 15, so that each of successive pairs of electrodes 16 project centrally and part-way into the two spaces formed between the three electrodes 19 that project from a registering bar 18. As a consequence, each pair of electrodes 16, and the three electrodes 19 with which they mesh, form for each bar segment 18 an interdigital grid, which is designed to function as a light-responsive switch as noted hereinafter.

Figure 4:
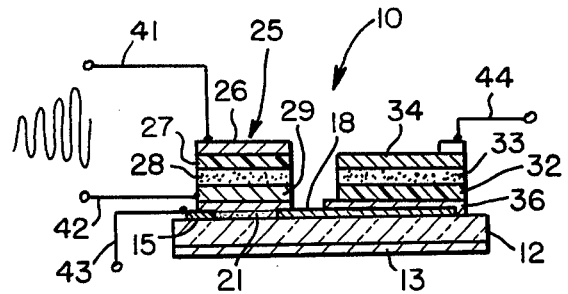
FIG. 4 is a fragmentary sectional view taken along the line 4—4 in FIG. 2 looking in the direction of the arrows.

Coated or deposited on the upper surface of substrate 12 in the spaces formed between the electrodes 16, 19 of each set thereof is a thin layer 21 (FIG. 4) of a photoconductive material such as a mixture of cadmium sulfide and cadmium selenide (CdS:CdSe). Each of these layers 24, only one of which is shown in FIG. 4, electrically couples together the conductor 15 with one of the bar segments 18 by way of the associated electrodes 16, 19. It is important to note that, although at opposite ends thereof each photoconductive layer 21 may slightly overlap the inner edges of the conductor 15 and the associated bar segment 18, nevertheless the sides of each layer 21 register approximately with the longitudinal side edges of the corresponding bar segment 18, so that adjacent layers 21 of the photoconductive material are laterally spaced from one another a distance approximately equal to the space 22 (FIG. 1) between adjacent bar segments 18.

Secured on the substrate 12 to overlie the interdigital grids 16, 19 and the adjacent edge of conductor 15 is an elongate EL lamp 25, whic may be referred to as the segment bar switching lamp. This switching lamp 25 comprises an upper, opaque electrode in the form of an elongate layer 26 of electrically conductive material such as metal foil or the like, a thin film or layer 27 of synthetic, dielectric material, such as polyvinyl-fluoride, or the like, which is secured to the underside of the foil layer 26, a layer 28 of electroluminescent (EL) phosphor coated on the underside of layer 27, and a lower electrode in the form of a translucent, electrically-conductive layer 29 of an indium oxide formulation, which is coated onto the underside of the EL layer 28, for example, as taught in my copending U.S. patent application Ser. No. 659,411, filed Feb. 19, 1976. The foil electrode 26 of this lamp faces upwardly, while the indium oxide layer 29 of this lamp faces downwardly relative to the substrate 12, and is secured to the upper face of the substrate, and to the intersecting portions of conductor 15 and the grids 16, 19, by a thin layer 30 of a binder material, such as a cyanoethyl starch adhesive. As shown more clearly in FIG. 1, opposite side edges of the lamp 25 overlap the inner edge of the conductor 15, and the inner ends of the bar segments 18, whereby lamp 25 effectively covers the spaced layers 21 of photoconductive material and the associated grid sets 16, 19.

Figure 3:
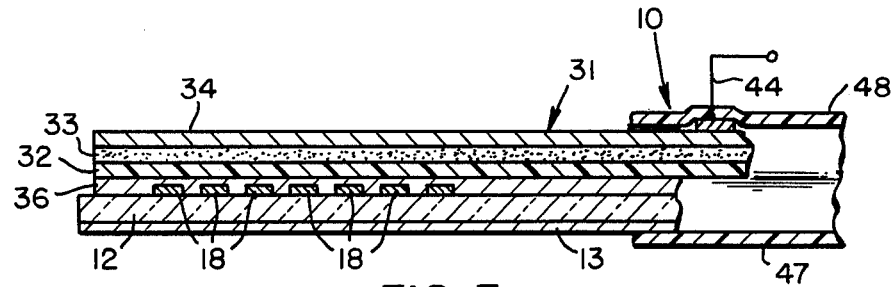
FIG. 3 is a fragmentary sectional view taken along the line 3—3 in FIG. 1 looking in the direction of the arrows, the thicknesses of the various layers of the bar graph again being greatly exaggerated for purposes of clarity.

Also secured to the upper face of the substrate 12 to overlie the ends of the segments 18 remote from the conductor 15, and extending in spaced, parallel relation to the lamp 25, is a second EL lamp 31, which may be referred to as the EL bar display lamp. This display lamp 31 differs from the switching lamp 25 in that its bottom layer 32, as illustrated in FIGS. 3 and 4, is not an electrode, but is made from a synthetic, dielectric material such as polyvinylfluoride. Its middle layer 33 comprises the usual electro-luminescent phosphor material, and its uppermost layer 34, which functions as its upper electrode, is made from a translucent, electrically-conductive indium oxide formulation of the type noted above. The bottom dielectric layer 32 of lamp 31 is secured on the substrate 12 over the outer ends of the segments 18 (the lower ends as illustrated in FIG. 1) by an adhesive layer 36, for example a cyanoethyl starch adhesive of the type noted above. With this construction, as noted hereinafter, it is the bar segments 18 which function as the lower electrodes for lamp 31.

Figure 2:
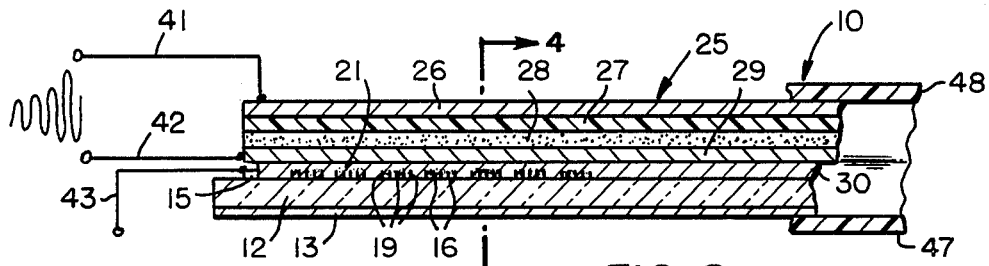
FIG. 2 is a fragmentary sectional view taken along the line 2—2 in FIG. 1 looking in the direction of the arrows, with the thicknesses of the various layers of the bar graph being greatly exaggerated for purposes of illustration.

To supply power to the switching lamp 25 electrical leads 41 and 42, such as thin strips of foil or the like, are secured at their inner ends, respectively, to the opaque electrode 26 and to one end (left end) of the light-transmissive indium oxide layer 29, as shown schematically in FIGS. 2 and 4. To provide illumination for the display lamp 31, similar leads 43 and 44 are secured at their inner ends, respectively, to the conductor 15 and to one end (the right end) of the indium oxide layer 34 of lamp 31, as illustrated schematically in FIGS. 3 and 4. Except for the outer ends of the leads 41 to 44, the above-described assembly is laminated within a protective pouch 46 (FIG. 1), which may comprise two layers 47 and 48 of plastic material that are secured over opposite sides of the lamp assembly and heat-sealed or otherwise secured to each other around their edges. The outer ends of the leads 41 to 44 project exteriorly of the pouch 46 for connection to electrical power supplies.

One sequence of steps for fabricating the EL bar graph 10 may comprise spraying a thin coat of "Dupont #4760" silver paint onto the face of substrate 12, then drying and firing it at 1000° F. for 10 minutes. Thereafter, cover the silver surface with photo-resist, and cover with a photo mask. Then expose the assembly to develop a pattern for etching away undesired silver areas and etch, leaving conductor 15 and segments 18. Then deposit CdS:CdSe powdered photoconductor through a mask which covers all of substrate 12 except the interdigital areas 21. Dry this assembly; and then carefully lift off the mask and fire the substrate for ten minutes in air at 450° C. Thereafter remove the assembly from furnace and cool in air; rinse in distilled $H_2O$; dip into a dilute solution of HCl; and again rinse in distilled water. While the assembly is still wet, dip it into a 20% solution of sodium silicate and dry at 320° F. Thereafter secure bar switching lamp 25 on the substrate with $InO_3$ electrode 29 facing photo switches 16, 19, and secure EL bar display lamp 31 on the substrate with cyanoethyl starch adhesive. Then apply the leads 41-44 and laminate the assembly in the protective pouch 46.

In use, an AC excitation voltage of uniform amplitude may be applied across conductor 15 and electrode 34 by the leads 43 and 44. At this stage, assuming that lamp 25 is deenergized, the layers 21 will be in their non-conductive modes, so that the signal applied to the conductor 15 will not be able to reach the bar segments 18 through the now-open switches represented by the respective sets of meshed electrodes 16, 19. Since no signal is applied to the bars 18 at this stage, the signal then being applied to the upper layer 34 of the display lamp 31 will not cause any excitation of the EL material in layer 33 of this lamp. Consequently, no portion of lamp 31 will glow at this time. Now, if a voltage of variable amplitude (a ramp voltage) is applied across the terminals 41 and 42, the photo-conductive switches represented by the meshed electrodes 16, 19, can be successively switched from their non-conductive to their conductive modes, commencing with the switch associated with the extreme left hand segment 18 as shown in FIG. 1, as the amplitude of the ramp signal increases. Conversely, as the amplitude of this ramp signal decreases, the photoconductive switches 16, 19 will be switched, in reverse order, back to their non-conductive modes.

The reason for this switching phenomenon is that the indium oxide layer 29 of the switching lamp 25 exhibits a high resistance to current flow in a longitudinal direction of the layer, but is highly conductive in a direction at right angles to the plane of the layer. Moreover, as shown more clearly in FIG. 2, the lead 42 is connected to the left hand end of layer 29, so that any ramp signal applied between the leads 41 and 42 tends to propagate from the left ends of layers 26 and 29 toward the right ends thereof (FIGS. 1 and 2). The extent to which the voltage drop between layers 29 and 26 of lamp 25 propagates from the left to the right depends upon the amplitude or intensity of the voltage applied across leads 41 and 42.

For example, when a given minimum voltage $V_o$ is applied across leads 41 and 42, most of the voltage will be dropped across the portions of the layers 26 and 29 located adjacent the left ends thereof, up to a point or area overlying the first set of meshed electrodes 16, 19, or in other words the photoconductive switch associated with the first bar segment 18 located adjacent the left end of the substrate 12. Consequently, the left end of the switching lamp 25 in the area above this first switch 16, 19 will be illuminated, causing light to be projected downwardly onto the layer of photoconductive material covering this first set of intermeshed electrodes 16, 19. This causes the CdS/CdSe layer 21 for this first switching element to change its electrical resistance to a low value, so that the voltage applied to the conductor 43 can now extend to the associated (first) segment bar 18. As soon as this occurs the portion of the indium oxide layer 34 positioned above and in registry with the first bar 18 (now functioning as a lower electrode for lamp 31) commences to glow, thereby forming on the upper face of the bar graph 10 a transversely extending, illuminated section that corresponds, in essence, to the configuration of the underlying bar segment 18.

As the amplitude of the voltage applied across leads 41 and 42 increases to values above $V_o$, the next successive photo-conductive switch 16, 19 in the series thereof will be switched to its conductive mode as a result of the illumination of the next successive portion of the overlying indium oxide layer 29. As each successive photoconductive switching device 16, 19 is switched to its "ON" mode, each of the associated bar electrodes 18 connected in series therewith causes the overlying, registering portion of the indium oxide layer 34 to glow. Thus, as the ramp voltage increases in amplitude, the successively energized electrodes 18 cause corresponding portions of the bar graph 10 to glow; and conversely, as the amplitude of this ramp voltage decreases, the illumination will disappear in reverse order from the face of the graph 10.

It is to be noted that the spaced sets of electrodes 16, 19 form discreet switching devices. For example, the illumination from lamp 25, which switches the first set of electrodes or grids 16, 19 into conductive mode, does not effect the second set — i.e., it does not radiate laterally so as to effect more than one set of grids at a time.

The uses for a bar graph of this type will be readily apparent to one skilled in the art. For example, if a thermocouple or some other form of temperature-responsive deivce capable of producing an electrical signal proportionate to temperature is employed to generate the ramp signal that is applied between lines 41 and 42, then the changes in the sensed temperature can be reflected by the illumination caused in the bar graph 10 by the bar segments 18. Obviously other analogue parameters which are capable of being converted to electrical signals likewise can be measured by the bar graph 10, for example, speed, pressure, linear and angular measurements, voltage, current, luminosity, etc. The face of the graph 10 would, of course, be calibrated and marked to denote the nature and corresponding quantum of the measurement represented by the input or ramp signal.

While in the embodiment illustrated the ramp voltage has been applied across the layers 26 and 29 by leads which are attached to registering ends of these layers, it will be understood that the positions of these respective leads could be altered depending upon the desired configuration of the bar graph. Likewise, while the lead 44 has been illustrated as being attached to a particular point on the layer 34 of lamp 31, it is to be understood that this lead could, if desired, extend longitudinally of the layer 34 without departing from this invention, since in any case the particular sections of the layer 34 that are illuminated will depend upon those of the bar segments 18 which are being energized by the conductor 15 through the various photoconductive switches 16, 19. Also, it will be apparent that the configurations and dispositions of the spaced electrodes 18 could be altered without departing from this invention, for example by disposing these electrodes in circular or curvilinear paths, or by making them in different sizes or shapes, etc.

Moreover, while only certain embodiments of the invention have been illustrated and described herein, it will be apparent that the invention is capable of further modification, and that this application is intended to cover any such modifications that may fall within the scope of one skilled in the art, or the appended claims.

Having thus described my invention, what I claim is:

1. An electroluminescent device, comprising
    a substrate,
    a first EL lamp on said substrate having a plurality of spaced, lower electrodes overlying one surface of said substrate, an upper, light-transmissive electrode overlying one end each of said lower electrodes, and a layer of EL material interposed between said upper electrode and the portions of the lower electrodes positioned therebeneath,
    a conductor mounted on said substrate in spaced, confronting relation to the opposite ends of said lower electrodes,
    a plurality of spaced, light-responsive switching means for selectively connecting said conductor to said opposite ends of said lower electrodes,
    means shielding said spaced switching means from ambient light normally to maintain said switching means substantially in electrically non-conductive modes, and responsive to an electrical signal of variable intensity successively to switch said spaced switching means from non-conductive to conductive modes as the intensity of said signal increases, and vice versa as the intensity of said signal decreases, and
    means for applying an AC signal across said conductor and said light-transmissive electrode, whereby as each of said spaced switching means is switched to its conductive mode, said upper electrode is illuminated in an area similar in configuration to the underlying portion of the lower electrode associated with the last-named switch means.

2. An electroluminescent device as defined in claim 1, wherein said shielding means comprises a second EL lamp overlying said spaced switching means, and having intermediate its ends a light emissive surface facing said switching means and responsive to said signal of increasing intensity to become progressively illuminated from one end thereof toward the other, and vice versa when the intensity of said signal decreases.

3. An electroluminescent device as defined in claim 2, wherein
    said second lamp comprises an opaque upper electrode, a light-transmissive lower electrode facing said switching means, and a layer of EL material between the two last-named electrodes, and
    said lower electrode of said second lamp is made from a material which exhibits a higher resistance to current flow in one direction than in another.

4. An electroluminescent device as defined in claim 3, wherein said second EL lamp is planar in configuration and said light-transmissive electrode is made from an indium oxide formulation.

5. An electroluminescent device as defined in claim 1, wherein each of said spaced switching means comprises
    a first plurality of wire-like conductors projecting from said opposite end of each of said lower electrodes and disposed in spaced, intermeshing relation with a second plurality of wire-like conductors projecting from the first-named conductor, and
    a layer of photoconductive material overlying said intermeshed conductors and filling the spaces therebetween.

6. An electroluminescent device as defined in claim 3, wherein
    said lower electrodes are rectangular in configuration and are disposed on said one surface of said substrate in spaced, parallel relation, and in a row extending intermediate the ends of said substrate,
    said conductor is secured to said one surface of said substrate with one edge thereof extending parallel to said row of electrodes in spaced, confronting relation to said opposite ends thereof, said spaced switching means comprises a plurality of spaced layers of photoconductive material connecting said opposite ends of said lower electrodes to said one edge of said conductor at spaced points therealong, and said second EL lamp is planar in configuration and is secured on said substrate with its lower, light transmissive electrode overlying said layers of photoconductive material, and has on one end thereof a terminal for connecting the source of said variable signal to the adjacent end of the last-named electrode, whereby light will propogate from said one end of said second lamp toward the opposite end thereof as the intensity of said signal increases.

7. An electroluminescent device for displaying analogue measurements, comprising a substrate having thereon a plane surface, an EL lamp mounted on said substrate and having intermediate its ends a light emissive surface facing said plane surface, terminal means on one end of said lamp adapted to be connected to a signal source of variable amplitude, said signal being operative to illuminate said lamp progressively from said one end thereof to the other as the amplitude of said signal increases, and vice versa as said amplitude decreases, a plurality of spaced electrodes secured on said plane surface and extending at one end each thereof transversely beneath said light emissive surface of said lamp, a conductor secured on said plane surface adjacent one edge of said lamp, a plurality of spaced, light-responsive switches positioned beneath said light emissive surface in a row which extends between the ends of said lamp, and operable selectively to connect said one ends of said electrodes to said conductor, a light-transmissive electrode overlying the opposite ends of said spaced electrodes and having on the underside thereof a layer of EL material, and means for applying an AC voltage across said conductor and said light-transmissive electrode, respectively, whereby when a signal of increasing amplitude is applied by said source to said lamp, the illumination therefrom successively energizes the switches in said row thereof, thereby successively to connect the associated spaced electrodes to said conductor, and thereby to illuminate successive portions of said light-transmissive electrode in areas corresponding in configuration to said opposite ends of said spaced electrodes.

8. An electroluminescent device as defined in claim 7, wherein said spaced electrodes are rectangular in configuration and are arranged in spaced, parallel relation in a row which extends parallel to said row of switches, and said EL lamp has an opaque, upper electrode which shields said switches from ambient light.

9. An electroluminescent device as defined in claim 7, wherein each of said switches comprises a plurality of spaced, wire-like projections extending, respectively, from said conductor and from said one end of each of said spaced electrodes, into overlapping, spaced, relation, and a thin layer of photoconductive material overlying said overlapping projections, the layer of photoconductive material for each switch being spaced laterally from the photoconductive material of adjacent switches, whereby said switches are energizable solely by the illumination from the overlying portion of said emissive surface on said lamp.

10. An electroluminescent device as defined in claim 8, wherein said lamp has a lower electrode separated from its upper electrode by a layer of EL material, and said lower electrode is made from a formulation of indium oxide.

* * * * *